(12) United States Patent
Ho et al.

(10) Patent No.: US 7,129,718 B2
(45) Date of Patent: Oct. 31, 2006

(54) METHOD AND STRUCTURE FOR MEASURING A BONDING RESISTANCE

(75) Inventors: Shu-Lin Ho, Yilan County (TW); Shih-Chieh Wang, Hsinchu (TW)

(73) Assignee: Hannstar Display Corp., Taipei (TW)

( * ) Notice: Subject to any disclaimer, the term of this patent is extended or adjusted under 35 U.S.C. 154(b) by 0 days.

(21) Appl. No.: 11/412,808

(22) Filed: Apr. 27, 2006

(65) Prior Publication Data

US 2006/0192572 A1 Aug. 31, 2006

Related U.S. Application Data

(62) Division of application No. 10/919,686, filed on Aug. 17, 2004, now Pat. No. 7,064,563.

(30) Foreign Application Priority Data

May 24, 2004 (TW) .............................. 93114671 A (51) Int. Cl.
*G01R 27/08* (2006.01)
(52) U.S. Cl. ...................................... 324/713; 324/770
(58) Field of Classification Search ................ 324/713
See application file for complete search history.

(56) References Cited

U.S. PATENT DOCUMENTS

| 5,365,180 A | * | 11/1994 | Edelman ...................... 324/715 |
| 5,450,016 A | * | 9/1995 | Masumori .................... 324/713 |
| 6,940,301 B1 | * | 9/2005 | Chen ............................ 324/770 |
| 2005/0259096 A1 | | 11/2005 | Ho et al. |

\* cited by examiner

*Primary Examiner*—Walter Benson
(74) *Attorney, Agent, or Firm*—Silicon Valley Patent & Group LLP (57) ABSTRACT

A structure and a method for measuring the bonding resistance are provided. The structure for measuring a bonding resistance between a first object and a second object is provided, wherein the first object has a plurality of first pins and a reference pin, and the second object has a plurality of second pins corresponding to the plurality of first pins and the reference pin. The structure further includes a first circuit formed by electrically connecting the reference pin to the first pin adjacent to the reference pin in a first direction, and a second circuit formed by electrically connecting a second pin corresponding to the reference pin to the adjacent second pin in a second direction. By connecting the first and the second circuits in series, the value of the bonding resistance is easily measured.

12 Claims, 12 Drawing Sheets

METHOD AND STRUCTURE FOR MEASURING A BONDING RESISTANCE

This application is a divisional of application Ser. No. 10/919,686, filed Aug. 17, 2004 now U.S. Pat. No. 7,064,563, which is incorporated herein by reference in its entirety.

FIELD OF THE INVENTION

This invention mainly relates to a method and a structure for measuring a bonding resistance, and more particularly to a method and a structure for measuring the bonding resistances between a cell of a liquid crystal display (LCD) and a flexible film and the bonding resistances between the flexible film and the printed circuit.

BACKGROUND OF THE INVENTION

Presently, the common module packaging technologies for LCD are Chip on film (COF), Tape Automated Bonding (TAB) and Chip On Glass (COG). These three technologies described above have become the main streams of the present module packaging technology, and they all use an anisotropic conductive film (ACF) as a conductive bonding medium. ACF is a material with high molecular weight and is formed by dispreading the mixture of the conductive particles and the adhesives on the materials containing the releasing agent. In general, the thickness of the ACF is ranged from 15 to 45 microns, and the different thickness of ACF is used for meeting the requirements of forming the bonding between different objects.

Since there is no way to directly evaluate the quality of the bonding between different components, the management and the development of the bonding area during the processes described above are basically relied on the final evaluative result of the product. Therefore the difficulty of development is increased since it usually takes too much time and money on the reliability experiments for getting an evaluation of the bonding.

The procedures of the current developmental technologies for the module process include the steps of: 1) preparing the standard of the cell and all the relevant component parts of making a trial product, 2) forming the Outer Lead Bonding (OLD), 3) bonding the ACF on the PCB (AOP) or proceeding the solder bonding, 4) assembling the back light module, 5) carrying out an inspection before shipping out the products, 6) carrying out the reliability experiments, such as a temperature-humidity-bias test (THB), a thermal shock test (TST) or a shock test, and 7) analyzing and solving the problems.

And the disadvantages of the current developmental technologies of the module process are described as following:

1) Currently, the developmental stage of the module process is a time-consuming process, and it takes at least two weeks to get an evaluative result. Since the resistance of the bonding area of ACF affects the evaluative result of the reliability experiments of the product, the bonding resistance should reach a standard level to be applied to the product in the module process. Currently, the only way to evaluate the bonding resistance or the quality of the bonding area is to analyze the evaluative result derived from the reliability experiments. In addition, the feasibility of the manufacturing process is determined by the functions of the manufactured product after carrying out the reliability experiments.

2) It is too expensive in the developmental stage of the module process that it must take the products as the test and verify samples.

3) Since there is no direct evidence, it is difficult to define the problems in each procedure by the final evaluative results in the developmental stage of the module process. While functional problems are found after analyzing the evaluative results derived from the reliability experiments, it is usual that much time is spent for redoing the experiment to find out the real problems. Even by doing that only the direction of the problems might be provided by indirect evidences. And the indirect evidences of the problems related to the bonding area are got by comparing the evaluative result with the known data of the other component parts.

4) It is very difficult and time-consuming to evaluate a new material in the developmental stage of the module process. As described above, if the new bonding component parts are introduced, such that a new ACF is used, it is necessary to carry out the new reliability experiments. And without any accidents, this process still takes at least two weeks to get an evaluation. In addition, the materials used for the experiments are very expensive.

5) It is impossible to manage the process by numerical data in the developmental stage of the module process. It is impossible for engineers to evaluate the quality of the bonding area by the exactly numerical data of the bonding resistance in the present module process, and it is often that the products are qualified in the small-scale trail run but some problems are appeared in the large-scale production. Furthermore, to re-evaluate the module process will cause a considerable loss of time and money.

Figure 1:
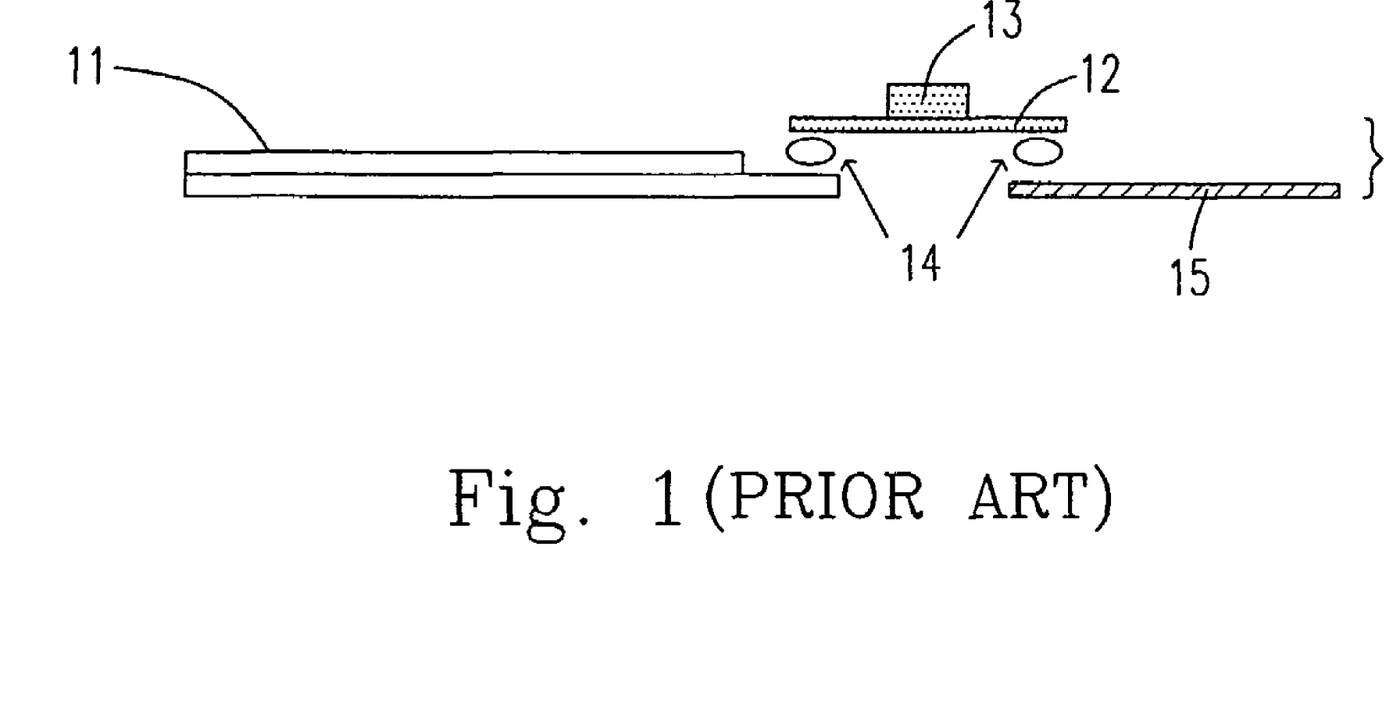
FIG. 1 is a schematic view showing the module bonding according to the prior art.
Figure 2:
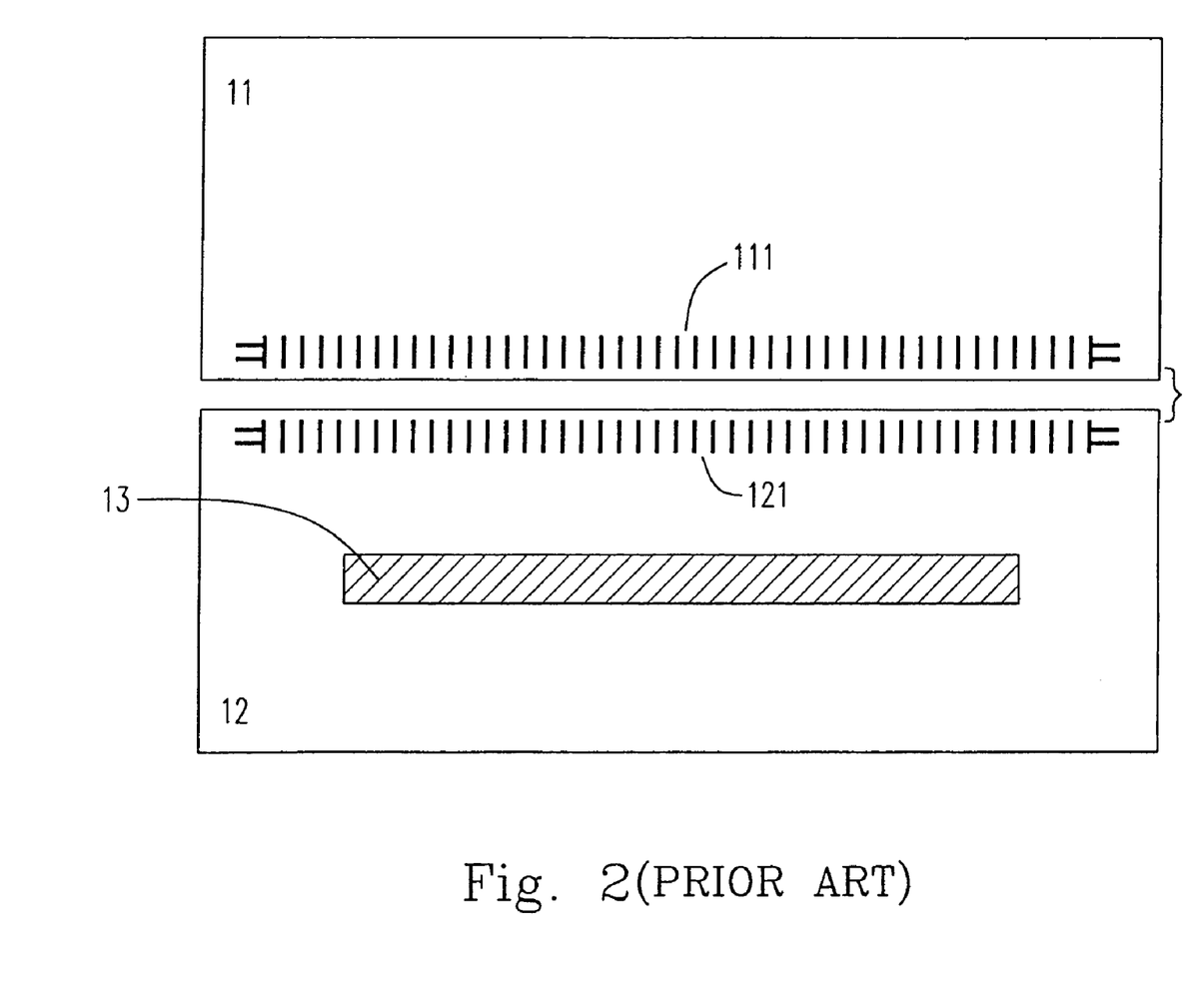
FIG. 2 is a schematic view showing the technical design of the outer lead bonding of the tape carrier packing according to the prior art.

Please refer to FIG. 1 and FIG. 2, which are respectively the schematic view showing the module bonding and the diagram showing the technical design of the outer lead bonding (OLB) of the tape carrier package (TCP) according to the prior art. As shown in FIG. 1, the bonding between the cell 11 and the flexible film 12 is formed by the ACF 14. The bonding between the flexible film 12 and the printed circuit board 15 is formed by the ACF 14. And the driver IC 13 is placed on the flexible film 12. As shown in FIG. 2, the cell 11 has a plurality of pins 111 and the flexible film 12 has a plurality of pins 121, wherein the bonding between the pins 111 and the pins 121 are formed by the ACF 14.

In view of the foresaid descriptions, the bonding between the cell 11 and the flexible film 12 and the bonding between the flexible film 12 and the printed circuit board 15 are formed by the ACF 14 in the present module packing technologies. The ACF 14 is used as a conductive bonding material. Therefore, the quality of the bonding between the cell 11 and the flexible film 12 or the value of the bonding resistance is related to the quality of the module process. The current technologies are unable to do a test directly on the product to examine the manufacturing process of the printed circuit board in real time, so that a test must be carried out on some product samples or a destructive examination must be carried out on the product to test and verify the process. Therefore, it is very inconvenient for the developmental stage of the module process and the analysis of the product currently. The limitations thereof are that it is unable to directly analyze the product and lots of time for the development of product will be lost since that when there is a problem happened on the product it is impossible to examine the influence of the module process thereon in real time. Moreover, in the current examination for the developmental stage of the module process, the dummy printed circuit board used is unable to provide a direct proof of the influence for the module process on the product. Also it costs more time and money but no better verification is obtained.

Since there is no measuring mechanism in the current module bonding technologies, it is very important to provide a mechanism for measuring the bonding resistance in the management of the bonding of the ACF. That is to say that with this design, there is no need to carry out the destructive examinations on products in the reliability experiments, and there is also no need to use the time-consuming and indirect test element group (TEG) samples to test and verify the module process. For that reason, the cost and the time expended and the numbers of experiments be carried out are greatly reduced, and the data can be used for the numerical managements of the mass-market product. In addition, the value of the bonding resistance could be the first item of the checking list.

SUMMARY OF THE INVENTION

In view of the foresaid discussions, a new method and a new structure for measuring a bonding resistance are expected. Therefore, the main object of the present invention is to provide a method and a structure for measuring the bonding resistance, wherein the pins are included in the circuits and all the circuits are arranged in series. Thus the exactly value of the bonding resistance of the pins can easily be measured by Triplet Meter (Amp-Ohm-Volt) and the numerical data of bonding materials can be utilized in the managements of the bonding component parts and the determination of the specifications of the bonding component parts.

Another object of the present invention is to provide a method and a structure for measuring the bonding resistance, by which, the numerical managements and the quantification of the new ACF or the new bonding material are available. And, by measuring the bonding resistance, the quality of the new ACF or the new bonding material is able to be evaluated directly.

Another object of the present invention is to provide another method and another structure for measuring the bonding resistance and the structure thereof. The developments of the new processes and the new materials can be put into practice on the product to get the direct evaluations. Therefore, there is no need to develop the test materials and is good for saving time, effort and cost.

In one respect of the present invention, a method for measuring a bonding resistance is provided. The method includes steps of: a) providing the first bonding object having a plurality of first pins and a reference pin device, b) providing the second bonding object having a plurality of second pins corresponding to the plurality of first pins and the reference pin device, wherein the pins and the reference pin device adjacent to each other are mutually insulated, c) forming a first circuit by electrically connecting the reference pin device to the respective first pin adjacent to the reference pin device in a first direction, d) forming a second circuit by electrically connecting a first said respective second pin corresponding to the reference pin device to a second said respective second pin adjacent to the first said respective second pin in a second direction, wherein the second direction is opposite to the first direction, e) connecting the first pins and the reference pin device to the second pins corresponding thereto; and f) measuring a resistance of the first circuit and the second circuit.

Preferably, the first circuit and the second circuit are arranged in series.

Preferably, the reference pin device has a first reference pin and a second reference pin respectively located on a left and a right sides of the first object.

Preferably, the method further includes steps of g) providing a third circuit for electrically connecting the first and second circuits to form a fourth circuit, and h) measuring a resistance of the fourth circuit, wherein the resistance is the bonding resistance between the first object and the second object.

Preferably, the first object is one selected from a group consisting of a liquid crystal display cell, a flexible film and a printed circuit board.

Preferably, the third circuit is located on the first object.

In another aspect of the present invention, a structure for measuring a bonding resistance between a first object and a second object is provided, wherein the first object has a plurality of first pins and a reference pin device, the second object has a plurality of second pins corresponding to the plurality of first pins and the reference pin device, and the pins and the reference pin device adjacent to each other are mutually insulated. The structure includes a first circuit formed by electrically connecting the reference pin to the respective first pin adjacent to the reference pin in a first direction, and a second circuit formed by electrically connecting a first the respective second pin corresponding to the reference pin device to a second the respective second pin adjacent to the first said respective second pin in a second direction, wherein the second direction is opposite to the first direction.

Preferably, the reference pin device has a first reference pin and a second reference pin respectively located on a left and a right sides of the first object.

Preferably, the structure further includes a third circuit electrically connecting to said first circuit and said second circuit to form a fourth circuit.

Preferably, the first object is one selected from a group consisting of a liquid crystal display cell, a flexible film and a printed circuit board.

Preferably, the third circuit is located on the first object.

The above contents and advantages of the present invention will become more readily apparent to those ordinarily skilled in the art after reviewing the following detailed descriptions and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

The principal idea of the present invention is to install the pins into the circuits and arrange all the circuits in series to make it possible to measure the correct value of bonding resistances of the pins with the triplet meter (Amp-Ohm-Volt) directly. Thus the numerical data of bonding component parts is utilized for the management thereof and is also utilized for making a determination for the specifications thereof.

Figure 3:
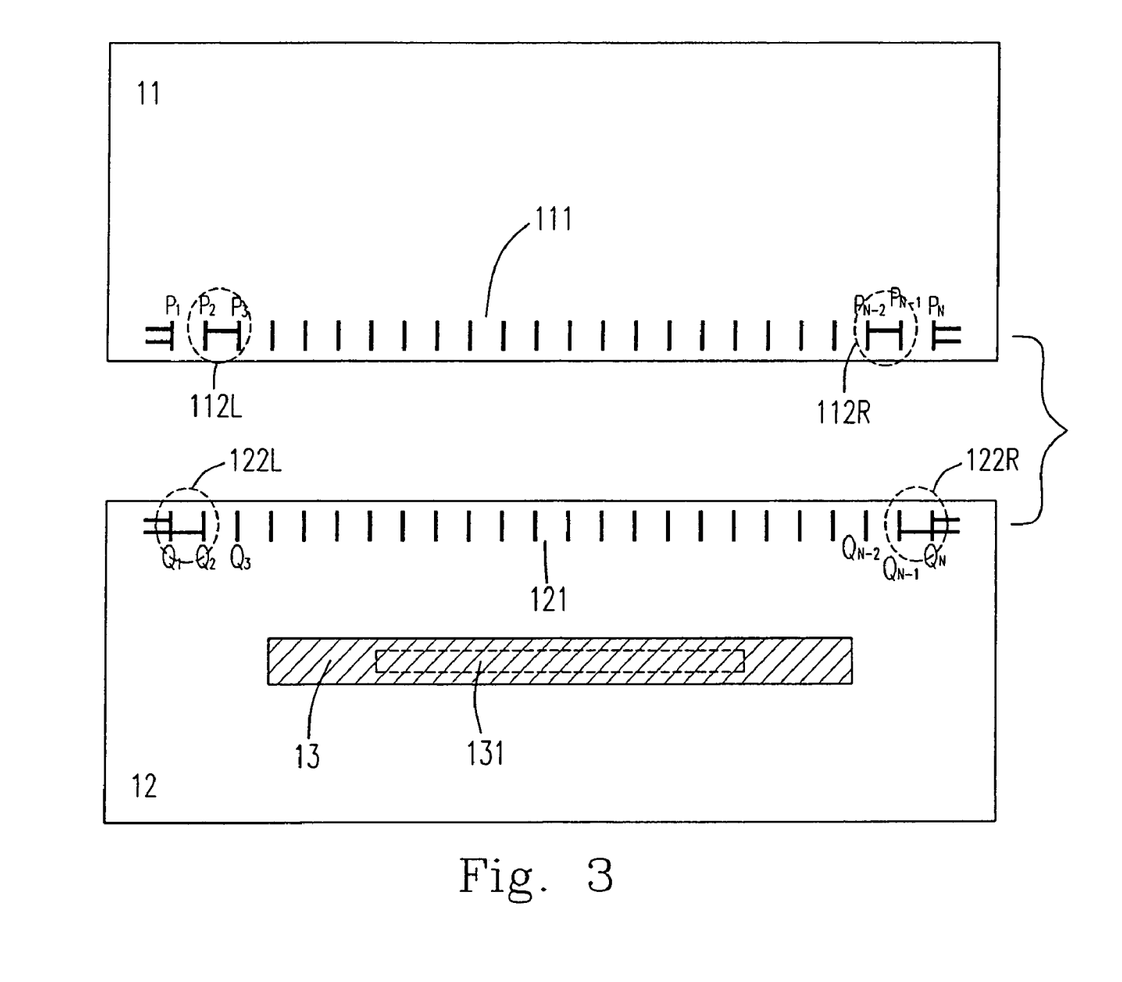
FIG. 3 is a schematic view showing the pins on the cell corresponding to the pins on the flexible film according to a preferred embodiment of the present invention.

Please refer to FIG. 3, which is a schematic view showing the pins on the cell corresponding to the pins on the flexible film according to a preferred embodiment of the present invention. As shown in FIG. 3, it illustrates the cell 11 and the flexible film 12 respectively having a plurality of pins 111 and 121, the circuit 112L on the left side of the cell 11, the circuit 112R on the right side of the cell 11, the circuit 122L on the left side of the flexible film 12, the circuit 122R on the right side of the flexible film 12, and the inside circuit 131 of the driver IC (integrated circuit) 13 on the flexible film 12, wherein the pins (111 and 112) adjacent to each other are mutually insulated.

Since the extreme ends on the left and the right side of the bonding are the most easily peeled parts, the extreme ends on both sides would be the most critical point of the bonding between the cell 11 and the flexible film 12 (such as a TCP film or a COF film). Therefore, as shown on the left side of FIG. 3, the preferred first circuit 112L is formed by electrically connecting the $P_2$ pin with the $P_3$ pin of the cell 11, wherein the $P_2$ pin and the $P_3$ pin are a pair of the adjutant pins and selected from the left side of the pins 111. The preferred second circuit 122L is formed by electrically connecting the $Q_1$ pin with the $Q_2$ pin of the flexible film 12, wherein the $Q_1$ pin and the $Q_2$ pin are a pair of the adjutant pins and selected from the left side of the pins 121.

Similarly, as shown on the right side of FIG. 3, the $P_{N-1}$ pin and the $P_{N-2}$ pin of the cell 11 can form a circuit 112 R as a foresaid first circuit 112L, wherein the $P_{N-1}$ pin and the $P_{N-2}$ pin are a pair of the adjutant pins and are selected from the right side of the pins 111. The $Q_N$ pin and the $Q_{N-1}$ pin of the flexible film 12 can form a circuit 122 R as a foresaid second circuit 122L, wherein the $Q_N$ pin and the $Q_{N-1}$ pin are a pair of the adjutant pins and are selected from the right side of the pins 121.

Figure 4A:
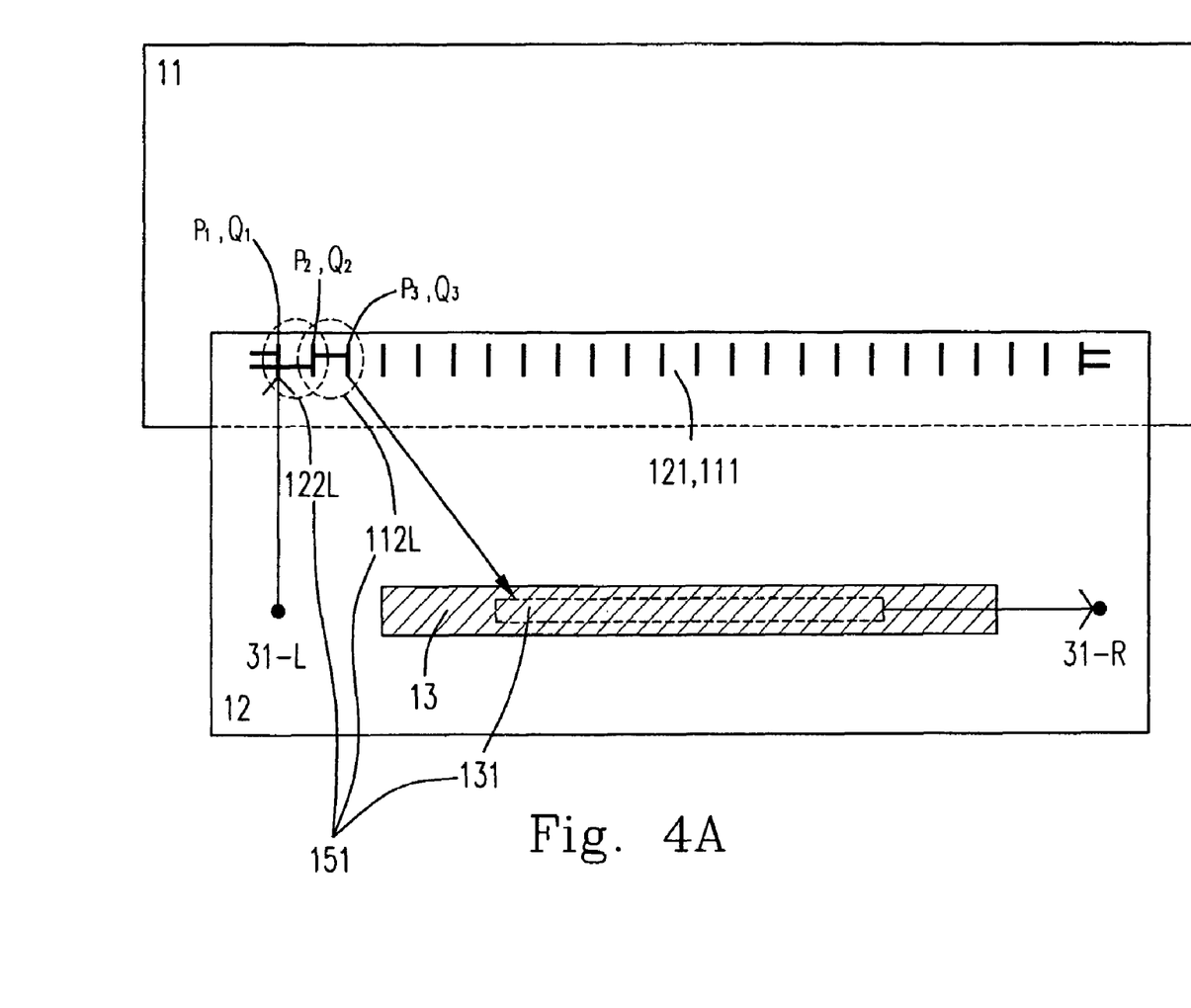
FIG. 4A is a schematic view showing an additional electrical connection of the bonding between the cell and the flexible film shown in FIG. 3.
Figure 4B:
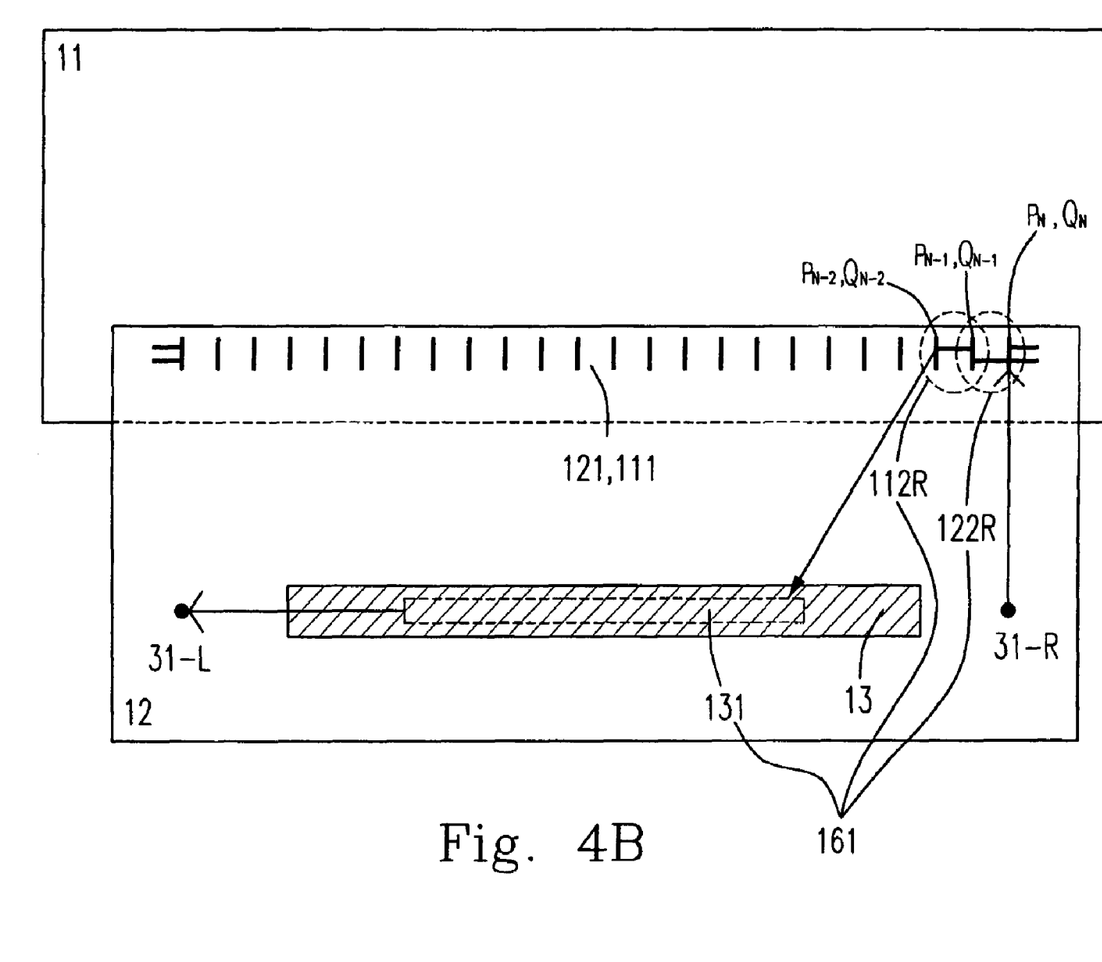
FIG. 4B is a schematic view showing another additional electrical connection of the bonding between the cell and the flexible film shown in FIG. 3.
Figure 4C:
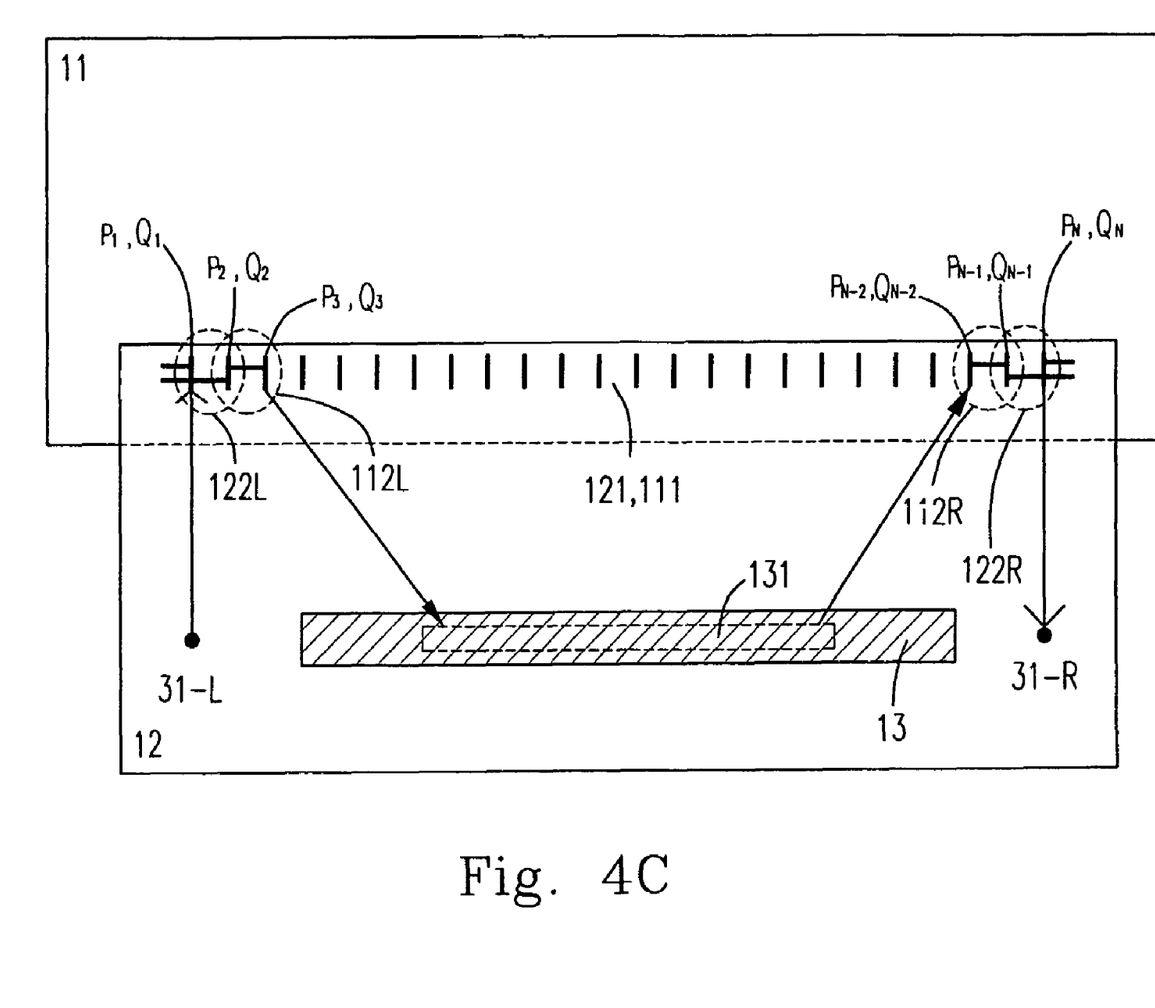
FIG. 4C is a schematic view showing another additional electrical connection of the bonding between the cell and the flexible film shown in FIG. 3

Please refer to FIGS. 4A–4C, which are schematic view showing the bonding between the cell 11 and the flexible film 12 shown in FIG. 3 by the ACF (not shown), wherein the pins (121 and 111) of the cell 11 and the flexible film 12 are correspondingly overlapped. As shown in FIG. 4A, a fourth circuit 151 is formed by electrically connecting the third circuit 131 with the first circuit 112L and the second circuit 122L, wherein the electrically connection of the first circuit 112L and the second circuit 122L is formed by the bonding material ACF (not shown) between the $P_2$ pin and the $Q_2$ pin. After electrically connecting the $Q_1$ pin of the second circuit 122L to the point of measurement 31-L and electrically connecting the third circuit 131 of the driver IC 13 to the point of measurement 31-R, wherein the points of measurement 31-L and 31-R are respectively located on the left and the right sides of the flexible film 12, it is possible to get the resistance of the fourth circuit 151 by measuring the resistance difference between the points of measurement 31-L and 31-R. Therefore, the evaluation of the quality of the bonding on the left side between the cell 11 and the flexible film 12 directly is doable.

Similarly, as shown in FIG. 4B, a circuit 161 as a foresaid the fourth circuit 151 is formed by electrically connecting the third circuit 131 with the circuit 112R and the circuit 122R, wherein the electrically connection of the circuit 112R and the circuit 122R is formed by the bonding material ACF between the $P_{N-1}$ pin and the $Q_{N-1}$ pin. After electrically connecting the $Q_N$ pin of the circuit 122R to the point of measurement 31-R and electrically connecting the third circuit 131 of the driver IC 13 to the point of measurement 31-L, the resistance of the circuit 161 is got by measuring the resistance difference between the points of measurement 31-L and 31-R. The evaluation of the quality of the bonding on the right side between the cell 11 and the flexible film 12 directly is doable.

In addition, as shown in FIG. 4C, after electrically connecting the measurement point 31-L, the first circuit 112L, the second circuit 122L, the third circuit 131, the circuit 122R, the circuit 112R and the measurement point 31-R, the bonding resistance between the cell 11 and the flexible film 12 could be measured directly by measuring the resistance difference between the points of measurement 31-L and 31-R.

Figure 5:
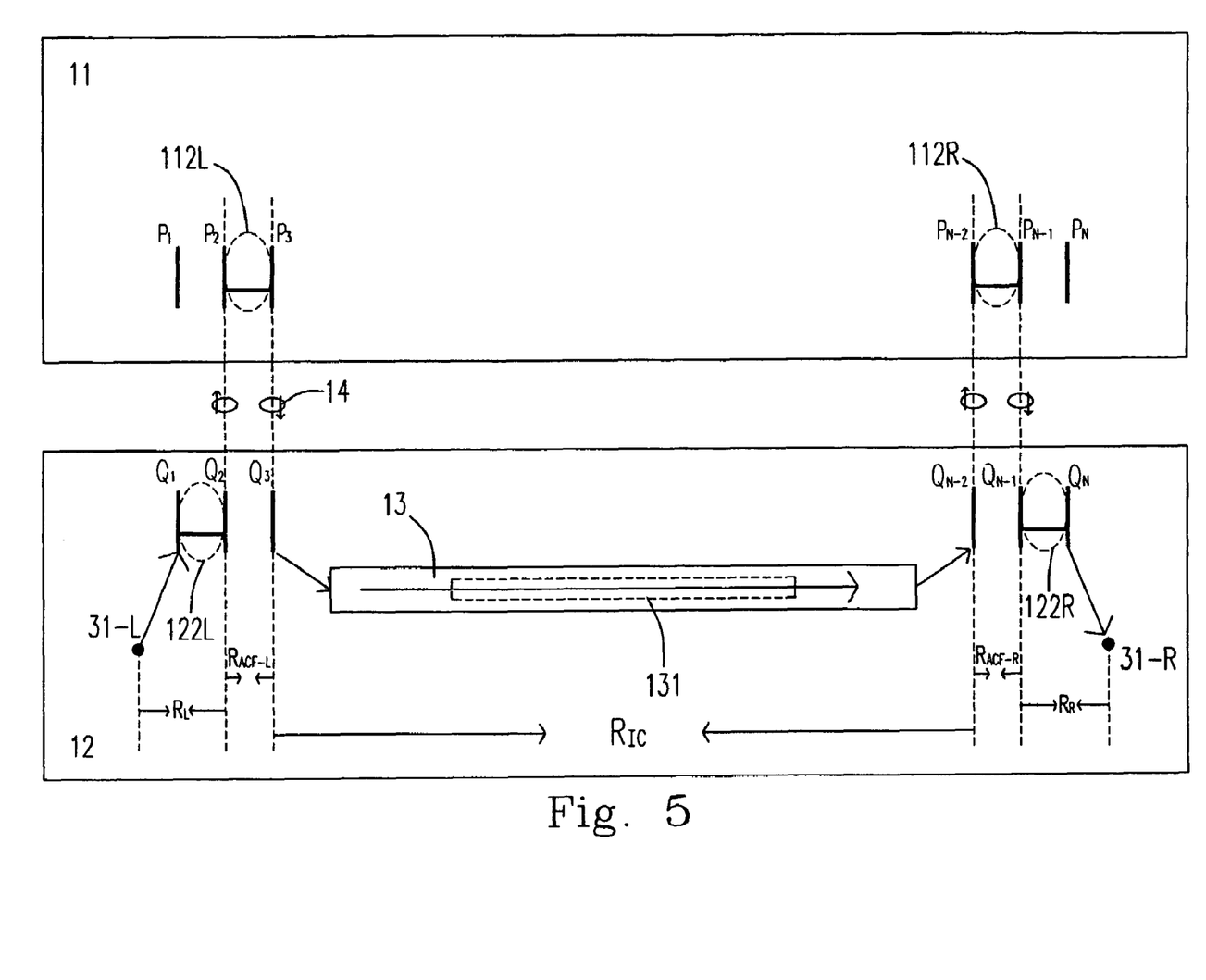
FIG. 5 is a schematic view showing the enlarged diagram of the pins arranged at the right side and the left side in FIG. 4.

Please refer to FIG. 5, which is a schematic view showing the enlarged diagram of the pins $P_1$, $P_2$, $P_3$, $Q_1$, $Q_2$, $Q_3$, $P_{N-2}$, $P_{N-1}$, $P_N$, $Q_{N-2}$, $Q_{N-1}$ and $Q_N$, which are arranged in the left side and the right side of FIG. 4C. As shown in FIG. 5, the bonding between the cell 11 and the flexible film 12 is formed by the ACF 14.

The bonding resistance between the cell 11 and the flexible film 12 would be measured directly by using the Triplet Meter (Amp-Ohm-Volt) to measure the resistance between the points of measurement 31-L and 31-R. The equation of the bonding resistance measured by the Triplet Meter (Amp-Ohm-Volt) is shown as below, wherein the R is the bonding resistance between the cell 11 and the flexible film 12, the $R_L$ is the resistance between the point of measurement 31-L and the $Q_2$ pin, the $R_{ACF-L}$ is the resistance between the $Q_2$ pin and the $Q_3$ pin, the $R_{1C}$ is the resistance of driver IC 13, the $R_{ACF-R}$ is the resistance between the $Q_{N-2}$ and the $Q_{N-1}$ pins and the $R_R$ is the resistance between the point of measurement 31-R and the $P_N$ pin:

$$R = R_L + R_{ACF-L} + R_{IC} + R_{ACF-R} + R_R$$

The values of $R_L$, $R_{IC}$ and $R_R$ of the practical component parts are considered as constant values since the error values thereof are considered very tiny. Accordingly, the value of the $R_{ACF-L}$ plus the $R_{ACF-R}$ is easily counted.

Besides being applied to measure the bonding resistance between the cell 11 and the flexible film 12, the method and the structure of present invention could be applied to measure the bonding resistance between the flexible film and the printed circuit board. Without affecting the function of the product, the structure of the flexible film and the printed circuit board are changed. The pins of the flexible film and the printed circuit board are changed as what shown in FIG. 6 based on the principle of connecting the circuit in series. That is to say, partial changes are made on the left and the right three pins of the flexible film and the printed circuit board for making the direct measurement of the bonding between the flexible film and the printed circuit board possible.

Figure 6:
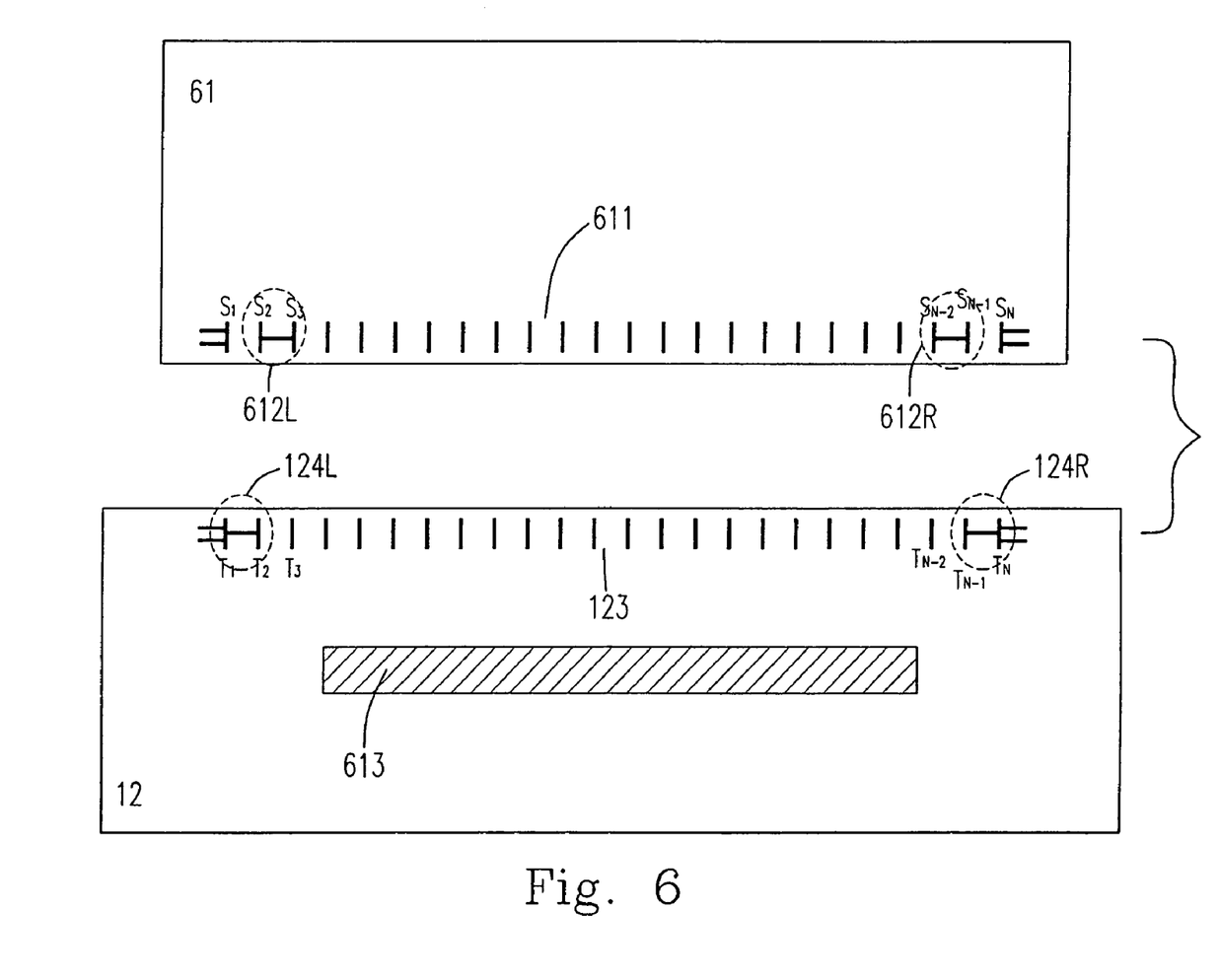
FIG. 6 is a schematic view showing the pins on the flexible film corresponding to the pins on the printed circuit board according to a preferred embodiment of the present invention.

Please refer to FIG. 6, which is a schematic view showing the pins on the flexible film 12 corresponding to the pins on the printed circuit board 61 according to a preferred embodiment of the present invention. As shown in FIG. 6, it illustrates the flexible film 12 and the printed circuit board 61 respectively having a plurality of pins 123 and 611, the circuit 124L on the left side of the flexible film 12, the circuit 124R on the right side of the flexible film 12, the circuit 612L on the left side of the printed circuit board 61, the circuit 612R on the right side of the printed circuit board 61 and the circuit 613 on the flexible film 12, wherein the pins (123 and 611) adjacent to each other are mutually insulated.

Since the extreme ends on the left and the right side of the bonding are the most easily peeled parts, the extreme ends on both sides would be the most critical point of the bonding between the flexible film 12 (such as a TCP film or a COF film) and the printed circuit board 61. Therefore, as shown on the left side of FIG. 6, the preferred first circuit 612L is formed by electrically connecting the $S_2$ pin with the $S_3$ pin of the printed circuit board 61, wherein the $S_2$ pin and the $S_3$ pin are a pair of the adjutant pins and selected from the left side of the pins 611. The preferred second circuit 124L is formed by electrically connecting the $T_1$ pin with the $T_2$ pin of the flexible film 12, wherein the $T_1$ pin and the $T_2$ pin are a pair of the adjutant pins and selected from the left side of the pins 123.

Figure 7A:
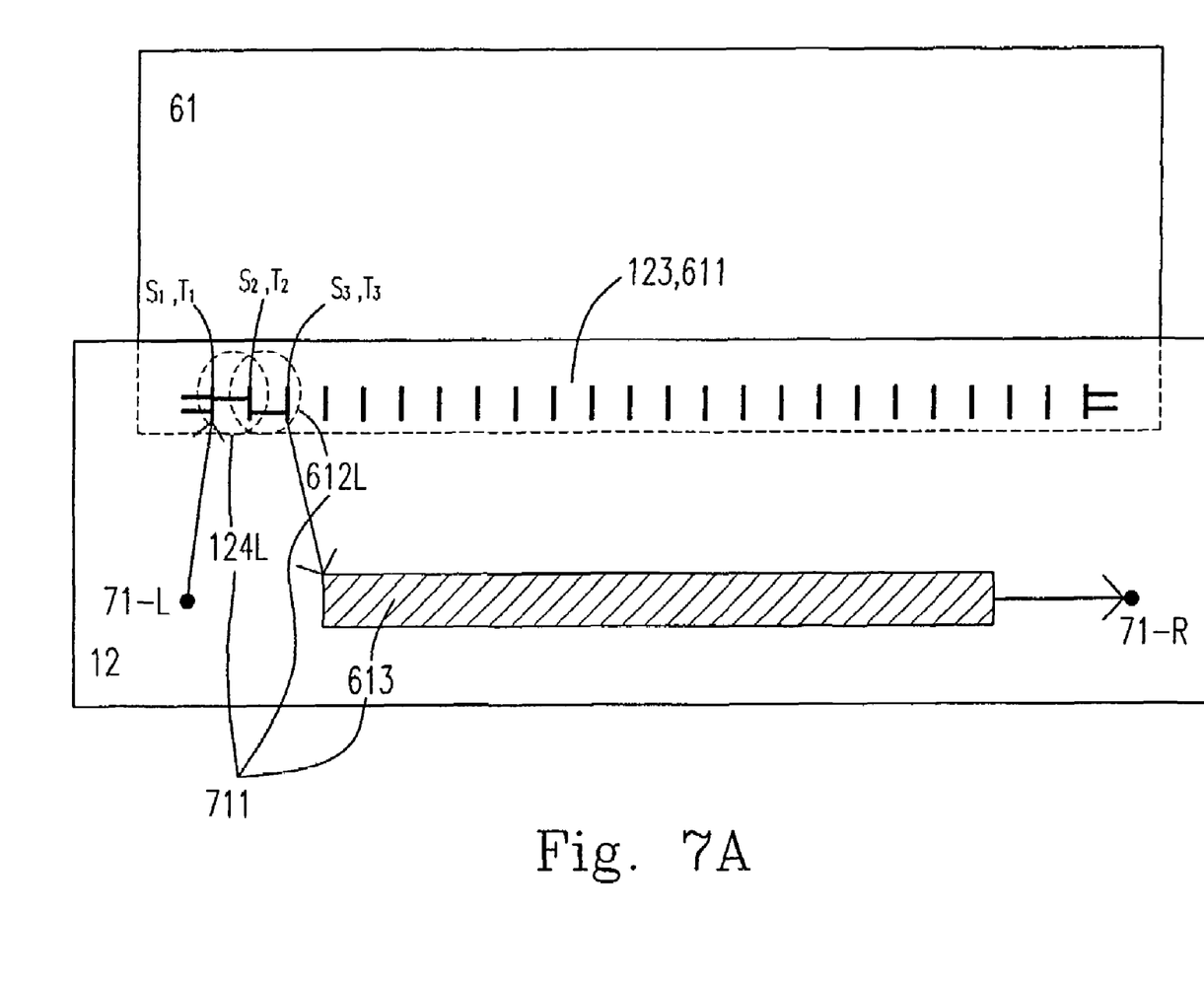
FIG. 7A is a schematic view showing an additional electrical connection of the bonding between the flexible film and the printed circuit board shown in FIG. 6.
Figure 7B:
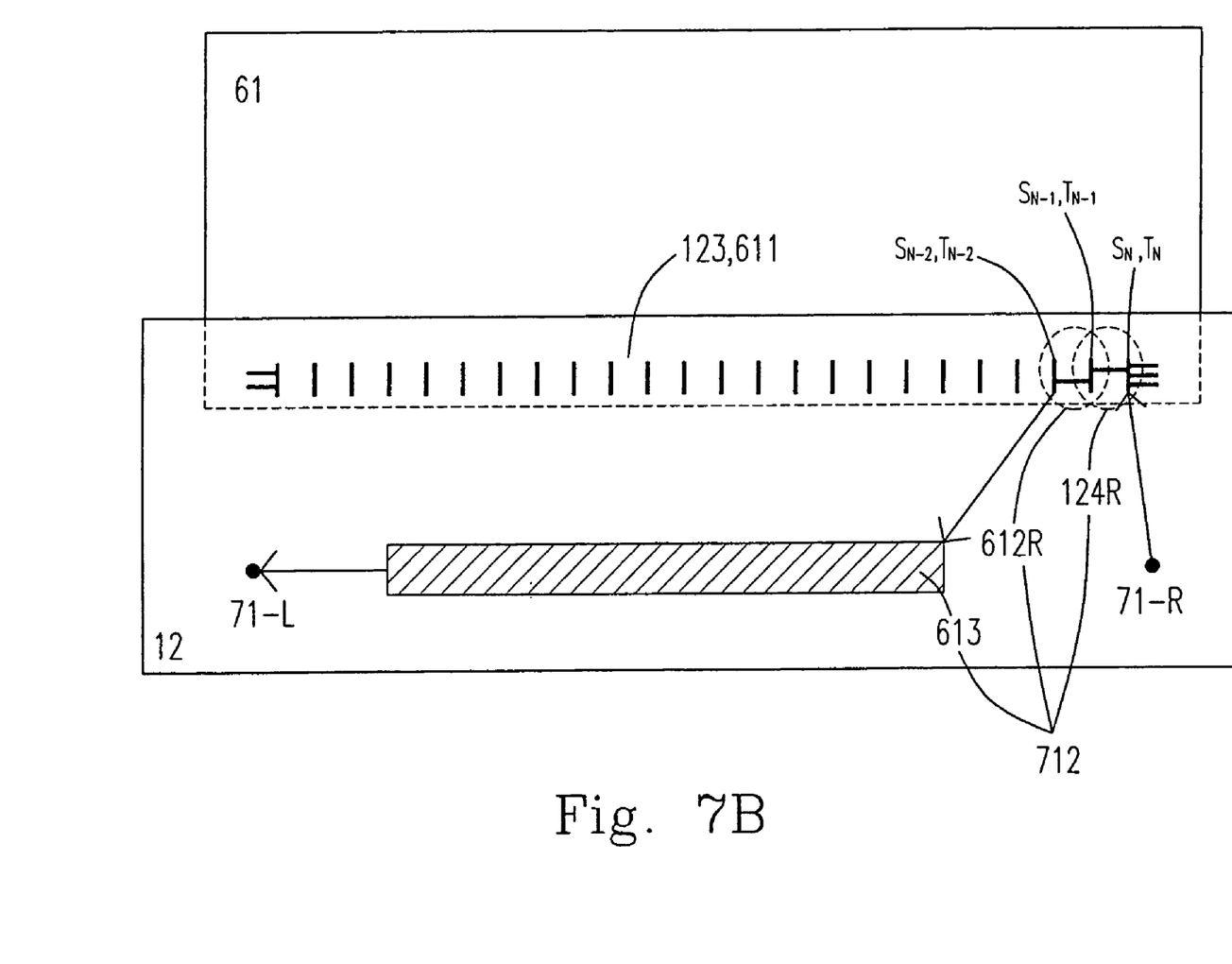
FIG. 7B is a schematic view showing another additional electrical connection of the bonding between the flexible film and the printed circuit board shown in FIG. 6.
Figure 7C:
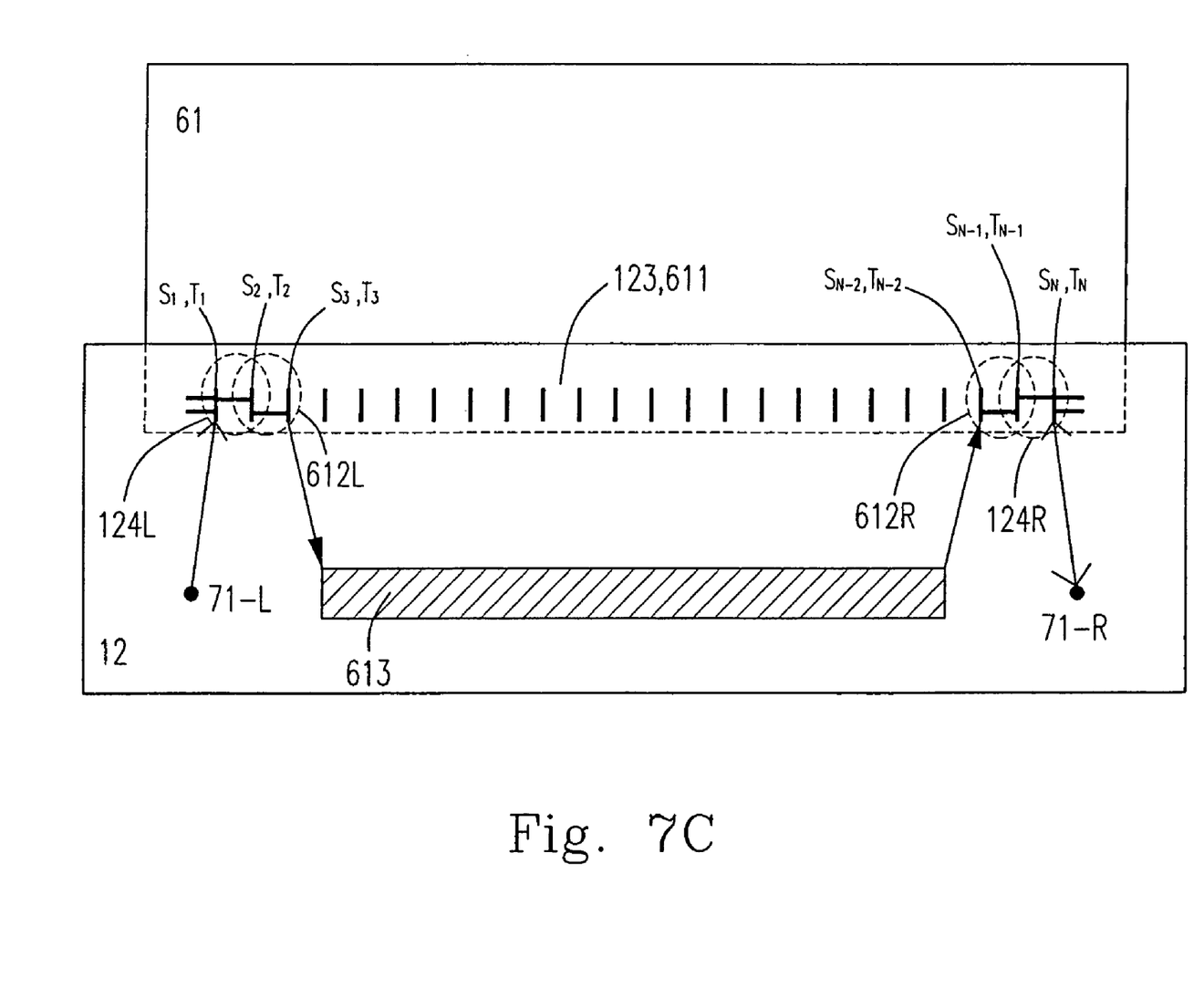
FIG. 7C is a schematic view showing another additional electrical connection of the bonding between the flexible film and the printed circuit board shown in FIG. 6.

Please refer to FIGS. 7A–7C, which are schematic view showing the bonding between the flexible film 12 and the printed circuit board 61 shown in FIG. 6 by the ACF (not shown), wherein the pins (123 and 611) of the flexible film 12 and the printed circuit board 61 are correspondingly overlapped. As shown in FIG. 7A, a fourth circuit 711 is formed by electrically connecting the third circuit 613 with the first circuit 612L and the second circuit 124L, wherein the electrically connection of the first circuit 612L and the second circuit 124L is formed by the bonding material ACF (not shown) between the $S_2$ pin and the $T_2$ pin. After electrically connecting the $T_1$ pin of the second circuit 124L to the point of measurement 71-L and electrically connecting the third circuit 613 to the point of measurement 71-R, wherein the points of measurement 71-L and 71-R are respectively located on the left and the right sides of the flexible film 12, it is possible to get the resistance of the fourth circuit 711 by measuring the resistance difference between the points of measurement 71-L and 71-R. Therefore, the evaluation of the quality of the bonding on the left side between the flexible film 12 and the printed circuit board 61 directly is doable.

Similarly, as shown in FIG. 7B, a circuit 712 as a foresaid the fourth circuit 711 is formed by electrically connecting the third circuit 613 with the circuit 124R and the circuit 612R, wherein the electrically connection of the circuit 612R and the circuit 124R is formed by the bonding material ACF between the $S_{N-1}$ pin and the $T_{N-1}$ pin. After electrically connecting the $T_N$ pin of the circuit 124R to the point of measurement 71-R and electrically connecting the third circuit 613 to the point of measurement 71-L, the resistance of the circuit 712 is got by measuring the resistance difference between the points of measurement 71-L and 71-R. The evaluation of the quality of the bonding on the right side between the flexible film 12 and the printed circuit board 61 directly is doable.

In addition, as shown in FIG. 7C, after electrically connecting the measurement point 71-L, the first circuit 612L, the second circuit 124L, the third circuit 613, the circuit 124R, the circuit 612R and the points of measurement 71-R, the bonding resistance between the flexible film 12 and the printed circuit board 61 could be measured directly by measuring the resistance difference between the points of measurement 71-L and 71-R.

Figure 8A:
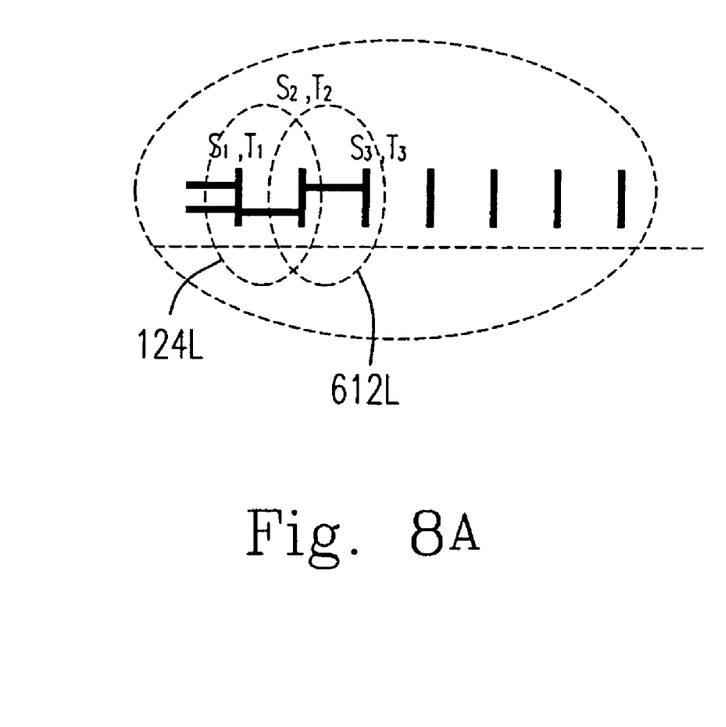
FIGS. 8A–8B are respectively schematic views showing the enlarged diagram of the pins arranged at the right side and the left side in FIG. 7C.
Figure 8B:
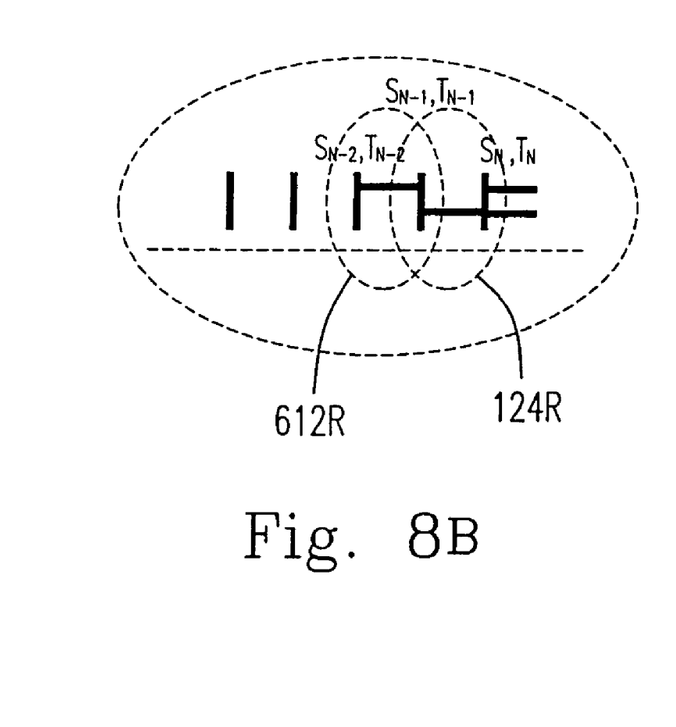

Please refer to FIGS. 8A–8B, which are respectively schematic views showing the enlarged diagram of the pins arranged in the left side and the right side of FIG. 7C. As shown in FIG. 8, the bonding between the flexible film 12 and the printed circuit board 61 is formed by the ACF (not shown).

Please refer to FIGS. 7C, 8A and 8B, the bonding resistance between the flexible film 12 and the printed circuit board 61 would be measured directly by using the Triplet Meter (Amp-Ohm-Volt) to measure the resistance between the points of measurement 71-L and 71-R. The equation of the bonding resistance measured by the Triplet Meter (Amp-Ohm-Volt) is shown as below, wherein the R is the bonding resistance between the flexible film 12 and the printed circuit board 61, the $R_L$ is the resistance between the point of measurement 71-L and the $T_2$ pin, the $R_{TCP-T2-PCB-S2}$ is the resistance between the $T_2$ and the $S_2$ pins, the $R_{PCB-S3-TCP-T3}$ is the resistance between the $S_3$ and the $T_3$ pins, the $R_{IC}$ is the resistance of the third circuit 613, the $R_{TCP-TN-2-PCB-SN-2}$ is the resistance between the $T_{N-2}$ and the $S_{N-2}$ pins, the $R_{PCB-SN-1-TCP-TN-1}$ is the resistance between the $S_{N-1}$ and the $T_{N-1}$ pin and the $R_R$ is the resistance between the point of measurement 71-R and the $T_{N-1}$ pin:

$$R=R_L+R_{TCP-T2-PCB-S2}+R_{PCB-S3-TCP-T3}+R_{IC}+R_{TCP-TN-2-PCB-SN-2}+R_{PCB-SN-1-TCP-TN-1}+R_R$$

The values of $R_L$, $R_{IC}$ and $R_R$ of the practical component parts are considered as constant values since the error values thereof are considered very tiny. Accordingly, the value of the $R_{TCP-T2-PCB-S2}$ plus the $R_{PCB-S3-TCP-T3}$ plus the $R_{TCP-TN-2-PCB-SN-2}$ plus the $R_{PCB-SN-1-TCP-TN-1}$ is easily counted.

As the above-mentioned descriptions, the advantages of the present invention are summarized as below:

1) The reliability experiment can be held directly on the component parts of the module packing, such as the TAB film or the COF film, and then the value of the bonding resistance is used to evaluate the result of the reliability experiment. Therefore, there is no need to use the product for testing and verifying and the enormously relevant cost is saved;

2) Regarding to the process of analyzing and solving of problem, the direct evidence is provided. The value of the bonding resistance is used to directly clarify that whether the module bonding is in a standard or not, and then to investigate the correctness of the settings of the module bonding for improving the yield of good products;

3) It is possible to proceed the numerical management and to make the quantification of the new ACF or new bonding materials. And the quality of the new ACF or the new bonding materials are evaluated directly based on the value of the bonding resistance;

4) It is possible to determine that if the conducting line inside the flexible film is broken, since the broken conducting line is usually found at the both sides of the flexible film.

When a break exits in a complete conducting pathway the bonding resistance is measured as an open circuit;

5) The process specification limitation is known by the combination of the process with the product directly. And, according to the present invention, the bonding resistance would be easily used as an index of work in the process management, and 6) The development of the new process or the new materials could be combined with the product directly to get a more direct conclusion. Since there is no need to develop another new sampling materials, the process could be more convenient and more time and money would be saved.

Therefore, the method provided in the present invention provides the structure and the method for effectively overcoming the disadvantages of the prior art. To sum up, the method provided in the present invention does have the novelty, the progressiveness, and utility in the industry.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A method for measuring a bonding resistance, comprising steps of:
   a) providing a first bonding object having a plurality of first pins and a reference pin device;
   b) providing a second bonding object having a plurality of second pins corresponding to said plurality of first pins and said reference pin device, wherein all of said pins and said reference pin device are insulated with each other;
   c) forming a first circuit by electrically connecting said reference pin device to said respective first pin adjacent to said reference pin device in a first direction;
   d) forming a second circuit by electrically connecting a first said respective second pin corresponding to said reference pin device to a second said respective second pin adjacent to said first said respective second pin in a second direction, wherein said second direction is opposite to said first direction;
   e) connecting said first pins and said reference pin device to said second pins corresponding thereto; and
   f) measuring a resistance made up of said first circuit and said second circuit, wherein said resistance is used to represent said bonding resistance between said first object and said second object.

2. The method as claimed in claim 1, wherein said first circuit and said second circuit are electrically connected in series.

3. The method as claimed in claim 1, wherein said first object is selected from a group consisting of a liquid crystal display cell, a flexible film and a printed circuit board.

4. The method as claimed in claim 1, wherein said second object is a flexible film.

5. A method for measuring a bonding resistance, comprising steps of:
   a) providing a first bonding object having a plurality of first pins and a reference pin device;
   b) providing a second bonding object having a plurality of second pins corresponding to said plurality of first pins and said reference pin device, wherein all of said pins and said reference pin device are insulated with each other;
   c) forming a first circuit by electrically connecting said reference pin device to said respective first pin adjacent to said reference pin device in a first direction;
   d) forming a second circuit by electrically connecting a first said respective second pin corresponding to said reference pin device to a second said respective second pin adjacent to said first said respective second pin in a second direction, wherein said second direction is opposite to said first direction;
   e) connecting said first pins and said reference pin device to said second pins corresponding thereto;
   f) providing third circuit electrically connected to said first and second circuits to form a fourth circuit; and
   g) measuring a resistance of said fourth circuit, wherein said resistance used to represent said bonding resistance between said first object and said second object.

6. The method as claimed in claim 5, wherein said first object is selected from a group consisting of a liquid crystal display cell, a flexible film and a printed circuit board.

7. The method as claimed in claim 6, wherein said third circuit is located on said second object.

8. The method as claimed in claim 7, wherein said second object is a flexible film.

9. The method as claimed in claim 5, wherein said third circuit is integrated in a driver IC located on said second object.

10. A method for measuring a bonding resistance comprising steps of:
    a) providing a first bonding object having a plurality of first pins and a reference pin device; wherein said reference pin device comprises a first reference pin and a second reference pin respectively located on a left and right side object;
    b) providing a second bonding object having a plurality of second pins corresponding to said plurality of first pins and said reference pin device, wherein all of said pins and said reference pin device are insulated with each other;
    c) forming a first circuit by electrically connecting said reference pin device to said respective first pin adjacent to said reference pin device in a first direction;
    d) forming a second circuit by electrically connecting a first said respective second pin corresponding to said reference pin device to a second said respective second pin adjacent to said first said respective second pin in a second direction, wherein said second direction is opposite to said first direction;
    e) providing a third circuit located on said second object;
    f) connecting said first pins and said reference pin device to said second pins corresponding thereto;
    g) electrically connecting said third circuit to a respective one of said first circuit and sail second circuit located on said left and said right sides of said first object to form a fourth circuit; and
    h) measuring a resistance of said fourth circuit, wherein said resistance is used to represent said bonding resistance between said first object and said second object.

11. The method as claimed in claim 10, wherein said third circuit is integrated in a driver IC located on said second object.

12. The method as claimed in claim 10, wherein said second object is a flexible film.

* * * * *